(12) United States Patent
Popp et al.

(10) Patent No.: US 7,495,324 B2
(45) Date of Patent: Feb. 24, 2009

(54) POWER SEMICONDUCTOR MODULE

(75) Inventors: Rainer Popp, Petersaurach (DE); Marco Lederer, Nürnberg (DE)

(73) Assignee: Semikron Elektronik GmbH & Co. KG, Nürnberg (DE)

(*) Notice: Subject to any disclaimer, the term of this patent is extended or adjusted under 35 U.S.C. 154(b) by 88 days.

(21) Appl. No.: 11/801,357

(22) Filed: May 9, 2007

(65) Prior Publication Data
US 2007/0272976 A1    Nov. 29, 2007

(30) Foreign Application Priority Data
May 9, 2006    (DE)    ............... 10 2006 021 412

(51) Int. Cl.
*H01L 23/02*    (2006.01)
(52) U.S. Cl. .................. 257/678; 257/712; 257/723
(58) Field of Classification Search .............. 257/678, 257/712, 723
See application file for complete search history.

(56) References Cited

U.S. PATENT DOCUMENTS 4,047,242 A * 9/1977 Jakob et al. ............. 361/714
6,291,880 B1 * 9/2001 Ogawa et al. ............. 257/723

FOREIGN PATENT DOCUMENTS

DE    103 16 355    7/2004
DE    103 06 643    8/2004

* cited by examiner

*Primary Examiner*—Roy K Potter
(74) *Attorney, Agent, or Firm*—Cohen Pontani Lieberman & Pavane LLP

(57) ABSTRACT

A power semiconductor module having an electrically insulating substrate, to be arranged with a circuit board. The circuit board is spaced apart from the substrate by a housing. First conductor tracks are disposed inside the substrate, facing the circuit board, for receiving power semiconductor devices which can be driven by a control IC device. Second conductor tracks are provided on the inside of the circuit board facing the substrate. In the housing, elastic connecting elements are pressure-contacted by a rigid pressure body to establish electrical connection between the first and second conductor tracks. An optimum electromagnetic compatibility is achieved due to the fact that IC conductor tracks and the control IC device are also provided on the inside of the substrate.

12 Claims, 2 Drawing Sheets

POWER SEMICONDUCTOR MODULE

BACKGROUND OF THE INVENTION

1. Field of the Invention

The invention relates to a power semiconductor module with resilient connecting elements.

2. Description of the Related Art

Such power semiconductor modules are known, for example, from German Patent Nos. DE 103 06 643 B4 and DE 103 16 355 B3, commonly assigned herewith. In these known power semiconductor modules, control IC devices are provided for driving power semiconductor devices on a circuit board provided on the substrate. This circuit board is a so-called custom board, i.e., in these known power semiconductor modules, the control IC devices for the power semiconductor devices provided on the substrate are implemented on the custom board. In such known power semiconductor modules, the substrate and the circuit boards are spaced apart from the substrate by the housing. Long connections are formed between the control IC devices and associated power semiconductor devices. These relatively long connections have the drawback that the electromagnetic compatibility of these known power semiconductor modules leaves room for improvement because the coupling-in of electromagnetic waves into these connections is proportional to their length.

SUMMARY OF THE INVENTION

It is an object of the invention to provide a power semiconductor module that can be produced simply, and with an improved electromagnetic compatibility.

It is a further object of the invention to provide a power semiconductor module with IC conductor tracks and a control IC device in addition to first conductor tracks for power semiconductor devices, all on the inside of the substrate.

In a preferred embodiment of the invention, the substrate is a DCB (direct copper bonding) substrate. IC conductor tracks are pressure-contacted by associated second conductor tracks of the circuit board by associated resilient connecting elements. The resilient connecting elements thus provide both load connections and control connections to the power semiconductor devices.

Since the power semiconductor devices and the control IC device are provided on the inside of the substrate and are contacted by the power semiconductor devices, relatively short connections are obtained between the power semiconductor devices and the control IC device. Shortening these connections improves the electromagnetic compatibility of the power semiconductor module according to the invention. A further advantage of the power semiconductor module according to the invention is that its production is simplified because the contacting of the power semiconductor devices and the control IC device are in the same plane, namely on the inside of the substrate facing the circuit board.

In the power semiconductor module according to the invention, the control IC device is preferably in electrical contact with the associated IC conductor tracks via bonding wires. Since the power semiconductor devices are also in contact with the associated first conductor tracks via bonding wires, a bonding machine may form the contacts with both the power semiconductor devices and the control IC device, in a single operating cycle. This can be done in a time-saving manner which improves the productivity of the production of a power semiconductor module according to the invention.

In the power semiconductor module according to the invention, the control IC device can be unpackaged. Such an unpackaged chip device can be easily connected to associated conductor tracks of the substrate via bonding wires. It is also possible for the control IC device to be a packaged device, for example, an SMD device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Further details, features and advantages obtained from the following description of an illustrative embodiment of the power semiconductor module according to the invention, illustrated in an enlarged scale in the drawing, in which.

DETAILED DESCRIPTION OF THE PRESENTLY PREFERRED EMBODIMENTS

Figure 1:
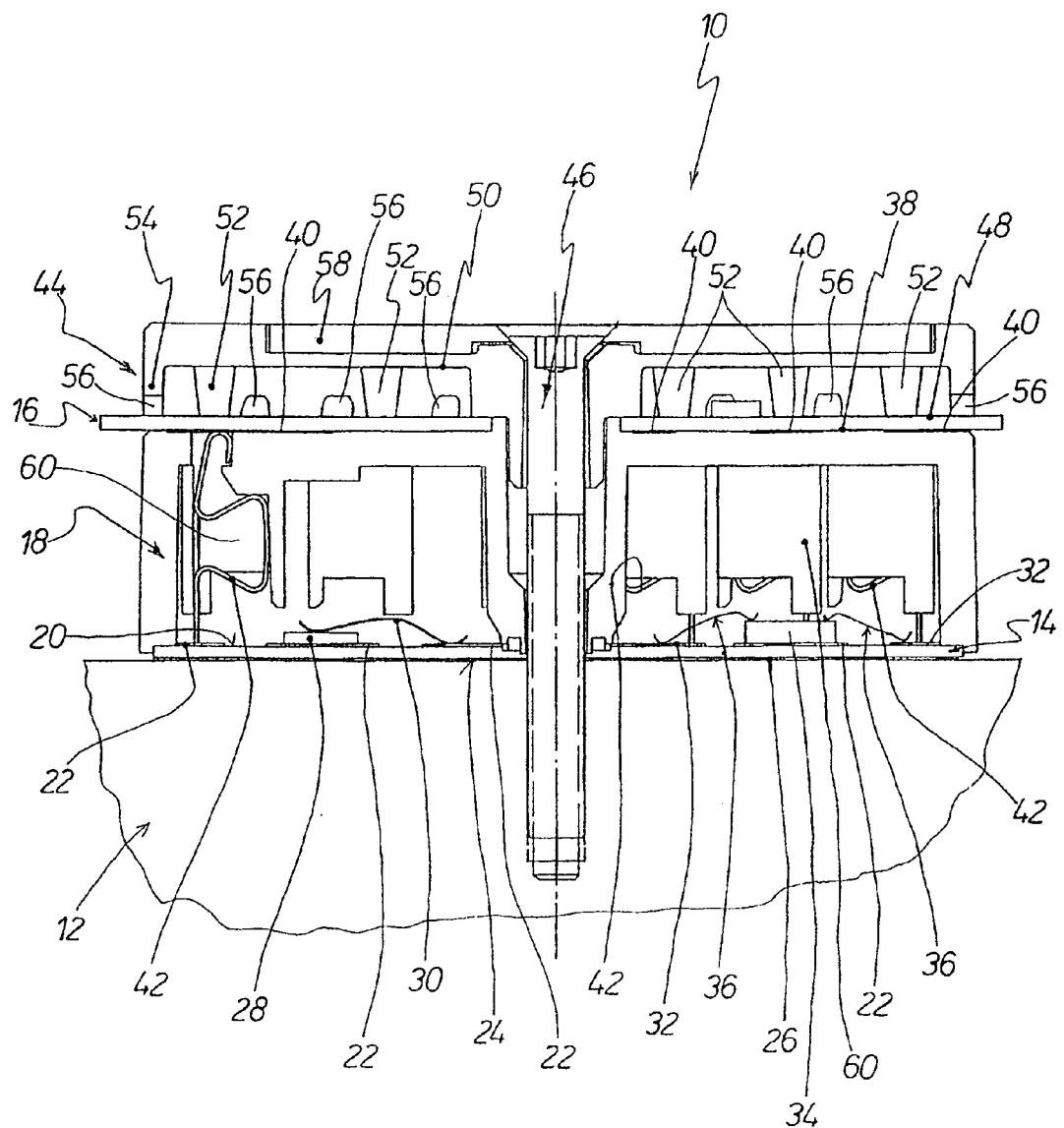
FIG. 1 is a cross-section through the power semiconductor module.

A power semiconductor module in accordance with the invention is shown in cross-section in FIG. 1, generally at 10. Power semiconductor module 10 is provided for direct assembly on a heat sink 12, drawn in sections. Power semiconductor module 10 has an electrically insulating substrate 14 and a circuit board 16 that is spaced apart from substrate 14 by a housing 18.

Figure 2:
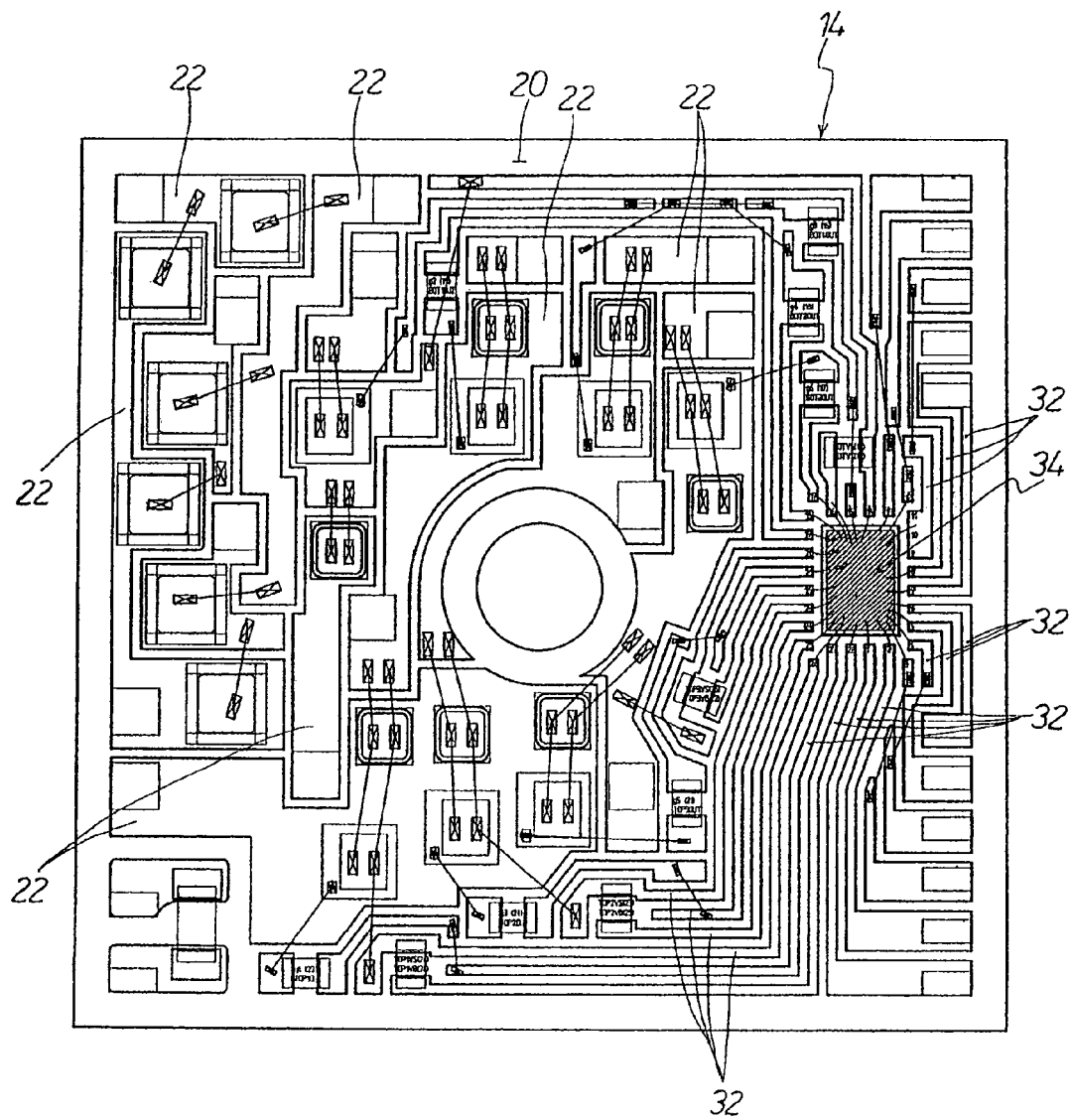
FIG. 2 is a top view of the substrate showing the first conductor tracks, the power semiconductor devices and the control IC device.

As can also be seen from FIG. 2, electrically insulating substrate 14 has first conductor tracks 22 disposed on its inside 20 facing the circuit board 16. On the outside 24 of the substrate 14 opposite to inside 20, electrically conductive substrate 14 is provided with a metal layer 26 to thermally couple electrically insulating substrate 14 to heat sink 12.

Power semiconductor devices 28 are arranged on the inside 20 of substrate 14. Each power semiconductor device 28 is in electrical contact with an associated first conductor track 22 by a bonding wire 30.

As can be seen clearly, especially from FIG. 2, IC conductor tracks 32 are also provided, in addition to first conductor tracks 22, on the inside 20 of electrically insulating substrate 14. IC conductor tracks 32 are provided for a control IC device 34 which is connected to IC conductor tracks 32 by bonding wires 36 (see FIG. 1).

Circuit board 16 of power semiconductor module 10 has second conductor tracks 40 on the inside 38 thereof, facing substrate 14. First conductor tracks 22 on the inside 20 of electrically insulating substrate 14 are pressure-contacted to second conductor tracks 40 on the inside 38 of circuit board 16 by resilient connecting elements 42. Resilient connecting elements 42 may be formed of any suitable resilient and conductive material. A material such as spring steel would be suitable.

The pressure-contacting is carried out with the aid of a rigid pressure body 44 which is forced against the outside 48 of circuit board 16 by a screw 46 screwed to heat sink 12. For this purpose, pressure body 44 is arranged on its inside 50 facing the circuit board 16 with pressure elements 52 and a peripheral collar 54. Peripheral collar 54 is arranged with spaced-apart recesses 56 through which cooling air may flow.

Rigid pressure body 44 may include a metal core 58 to increase the rigidity of the assembly.

Housing 18 may include slot-shaped guide channels 60 to accommodate resilient connecting elements 42.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising for use with a circuit board:
   an electrically insulating substrate having a housing to support the circuit board and space the circuit board from said substrate;
   first conductor tracks disposed on the inside of said substrate facing the circuit board for receiving power semiconductor devices;
   second conductor tracks disposed on the inside of the circuit board facing said substrate;
   resilient connecting elements pressure-contacted in the housing for establishing electrical connection between respective ones of said first conductor tracks and said second conductor tracks;
   IC conductor tracks disposed within said substrate; and
   a control IC device for driving the power semiconductor devices, said control IC device being disposed within said substrate.

2. The power semiconductor module of claim 1, further comprising bonding wires that form contacts between said control IC device and said IC conductor tracks.

3. The power semiconductor module of claim 2 further comprising a rigid pressure body that urges said resilient connecting elements into contact with said first and second conductor tracks.

4. The power semiconductor module of claim 2, wherein the control IC device is an unpackaged chip device.

5. The power semiconductor module of claim 4 further comprising a rigid pressure body that urges said resilient connecting elements into contact with said first and second conductor tracks.

6. The power semiconductor module of claim 2, wherein the control IC device is a packaged device.

7. The power semiconductor module of claim 6 further comprising a rigid pressure body that urges said resilient connecting elements into contact with said first and second conductor tracks.

8. The power semiconductor module of claim 1, wherein the control IC device is an unpackaged chip device.

9. The power semiconductor module of claim 8 further comprising a rigid pressure body that urges said resilient connecting elements into contact with said first and second conductor tracks.

10. The power semiconductor module of claim 9, wherein the control IC device is a packaged device.

11. The power semiconductor module of claim 10 further comprising a rigid pressure body that urges said resilient connecting elements into contact with said first and second conductor tracks.

12. The power semiconductor module of claim 1 further comprising a rigid pressure body that urges said resilient connecting elements into contact with said first and second conductor tracks.

* * * * *